US012772611B2

(12) United States Patent
Liu

(10) Patent No.: US 12,772,611 B2
(45) Date of Patent: Oct. 20, 2026

(54) METHOD FOR EPITAXY OF HIGH ELECTRON MOBILITY TRANSISTOR

(71) Applicant: GLOBALWAFERS CO., LTD., Hsinchu City (TW)

(72) Inventor: Jia-Zhe Liu, Hsinchu City (TW)

(73) Assignee: GLOBALWAFERS CO., LTD., Hsinchu City (TW)

( * ) Notice: Subject to any disclaimer, the term of this patent is extended or adjusted under 35 U.S.C. 154(b) by 519 days.

(21) Appl. No.: 18/212,798

(22) Filed: Jun. 22, 2023

(65) Prior Publication Data

US 2024/0063291 A1 Feb. 22, 2024

Related U.S. Application Data

(60) Provisional application No. 63/399,101, filed on Aug. 18, 2022.

(51) Int. Cl.
*H01L 29/66* (2006.01)
*H10D 30/01* (2025.01)
(Continued)

(52) U.S. Cl.
CPC ........ *H10H 20/815* (2025.01); *H10D 30/015* (2025.01); *H10D 30/475* (2025.01);
(Continued)

(58) Field of Classification Search
CPC ........... H10H 20/815; H10H 20/01335; H10H 20/0137; H10H 20/825; H10H 20/01;
(Continued)

(56) References Cited

U.S. PATENT DOCUMENTS 8,709,843 B2 4/2014 Shakuda
8,785,942 B2 * 7/2014 Yoshida ............. H10P 14/2901 257/191

(Continued)

FOREIGN PATENT DOCUMENTS

CN 103415934 A 11/2013
CN 106684213 A 5/2017

(Continued)

OTHER PUBLICATIONS

Taiwanese Search Report for Taiwanese Application No. 111141316, dated Sep. 5, 2023, with English translation.

(Continued)

*Primary Examiner* — Jay C Kim
(74) *Attorney, Agent, or Firm* — Birch, Stewart, Kolasch & Birch, LLP

(57) ABSTRACT

A method for epitaxy of a high electron mobility transistor includes: provide a substrate; form a nucleation layer on the substrate; form a buffer layer on the nucleation layer; form a first nitride layer being in contact with the buffer layer on the buffer layer; form a second nitride layer being in contact with the first nitride layer on the first nitride layer, and perform carbon doping on the second nitride layer; form a channel layer on the second nitride layer; and form a barrier layer on the channel layer; a two-dimensional electron gas is formed in the channel layer along an interface between the channel layer and the barrier layer; a growth temperature of the second nitride layer is less than a growth temperature of the first nitride layer; a film thickness of the first nitride layer is less than a film thickness of the second nitride layer.

17 Claims, 4 Drawing Sheets

(51) Int. Cl.

| | |
|---|---|
| ***H10D 30/47*** | (2025.01) |
| ***H10D 62/10*** | (2025.01) |
| ***H10D 62/85*** | (2025.01) |
| ***H10H 20/01*** | (2025.01) |
| ***H10H 20/815*** | (2025.01) |
| ***H10H 20/825*** | (2025.01) |

(52) U.S. Cl.
CPC ......... *H10D 62/10* (2025.01); *H10D 62/8503* (2025.01); *H10H 20/01335* (2025.01); *H10H 20/0137* (2025.01); *H10H 20/825* (2025.01)

(58) Field of Classification Search
CPC ...... H10H 20/81; H10H 20/84; H10D 30/015; H10D 30/475; H10D 62/10; H10D 62/8503
See application file for complete search history.

(56) References Cited

U.S. PATENT DOCUMENTS

| | | | | |
|---|---|---|---|---|
| 8,785,943 | B2 * | 7/2014 | Shioda | H10P 14/3416 257/E29.089 |
| 8,860,038 | B2 * | 10/2014 | Iwami | H10D 30/4755 257/190 |
| 8,928,000 | B2 * | 1/2015 | Hung | H10H 20/811 257/E29.089 |
| 9,111,839 | B2 * | 8/2015 | Hoteida | H10D 62/8162 |
| 9,184,241 | B2 * | 11/2015 | Ishiguro | H10D 30/015 |
| 9,391,145 | B2 * | 7/2016 | Hikosaka | H10D 62/852 |
| 9,608,075 | B1 * | 3/2017 | Wan | H10D 30/475 |
| 10,068,858 | B2 * | 9/2018 | Abe | H10P 14/3211 |
| 10,186,421 | B2 * | 1/2019 | Fukazawa | H10P 14/3416 |
| 10,431,656 | B2 * | 10/2019 | Ishiguro | H10D 62/8503 |
| 11,316,018 | B2 * | 4/2022 | Narukawa | H10D 62/82 |
| 11,469,101 | B2 * | 10/2022 | Cheng | H10D 30/475 |
| 11,476,115 | B2 * | 10/2022 | Narukawa | H10P 14/2905 |
| 11,508,830 | B2 * | 11/2022 | Dellas | H10D 30/015 |
| 2008/0258151 | A1 | 10/2008 | Kim | |
| 2012/0025203 | A1 * | 2/2012 | Nakata | H10D 62/8503 257/E29.089 |
| 2017/0054014 | A1 | 2/2017 | Nakayama et al. | |
| 2021/0273084 | A1 | 9/2021 | Chen et al. | |
| 2022/0181466 | A1 | 6/2022 | Dellas et al. | |

FOREIGN PATENT DOCUMENTS

| | | | |
|---|---|---|---|
| EP | 1 071 143 | A1 | 1/2001 |
| JP | 2012-15303 | A | 1/2012 |
| JP | 2013-30725 | A | 2/2013 |
| JP | 2013-42032 | A | 2/2013 |
| JP | 2016-184663 | A | 10/2016 |
| JP | 2017-92369 | A | 5/2017 |
| JP | 2019-505459 | A | 2/2019 |
| JP | 2019-41134 | A | 3/2019 |
| JP | 2020-145331 | A | 9/2020 |
| TW | 201212278 | A1 | 3/2012 |
| TW | 201344804 | A | 11/2013 |
| TW | 201611357 | A | 3/2016 |
| TW | 201911570 | A | 3/2019 |
| TW | 202025486 | A | 7/2020 |
| TW | 202105473 | A | 2/2021 |
| WO | WO 2020/149184 | A1 | 7/2020 |

OTHER PUBLICATIONS

Taiwanese Search Report dated Jul. 3, 2023 for Application No. 111141317 with an English translation.
Taiwanese Search Report dated Jun. 28, 2023 for Application No. 111141318 with an English translation.
Taiwanese Search Report dated May 16, 2023 for Application No. 111141320 with an English translation.

* cited by examiner

METHOD FOR EPITAXY OF HIGH ELECTRON MOBILITY TRANSISTOR

CROSS REFERENCE TO RELATED APPLICATIONS

This non-provisional application claims the benefit under 35 U.S.C. § 119 (e) to U.S. Provisional Application No. 63/399,101, filed on Aug. 18, 2022, all of which are hereby expressly incorporated by reference into the present application.

BACKGROUND OF THE INVENTION

Technical Field

The present invention relates generally to a semiconductor technology, and more particularly to a high electron mobility transistor.

Description of Related Art

A High Electron Mobility Transistor (HEMT) is typically a transistor having a two-dimensional electron gas (2-DEG) that is located close to a heterojunction of two materials with different energy gaps. As the HEMT makes use of the 2-DEG having a high electron mobility as a carrier channel of the transistor instead of a doped region, the HEMT has features of a high breakdown voltage, a high electron mobility, a low on-resistance, and a low input capacitance, thereby could be widely applied to high power semiconductor devices.

However, in a conventional HEMT, formation materials of different layers are different and have different coefficients of thermal expansion. Thus, when the HEMT is subjected to a change of different temperatures, different stresses originated from different formation materials might cause the formation of cracks on a surface of the HEMT or problems such as bowing or breakage, thereby affecting the performance of breakdown voltage of the HEMT. Therefore, how to reduce the defects, such as cracks, bowing, breakages, occurred on the HEMT, is a problem needed to be solved in the industry.

BRIEF SUMMARY OF THE INVENTION

In view of the above, the primary objective of the present invention is to provide a method for epitaxy of a high electron mobility transistor, which could reduce the defects, such as cracks, bowing, breakages, etc., of the high electron mobility transistor.

The present invention provides a method for epitaxy of a high electron mobility transistor includes steps of: provide a substrate; form a nucleation layer on the substrate; form a buffer layer on the nucleation layer; form a first nitride layer on the buffer layer, wherein the first nitride layer is in contact with the buffer layer; form a second nitride layer on the first nitride layer, and perform carbon doping on the second nitride layer, wherein the second nitride layer is in contact with the first nitride layer; form a channel layer on the second nitride layer; and form a barrier layer on the channel layer, wherein a two-dimensional electron gas is formed in the channel layer along an interface between the channel layer and the barrier layer; wherein a growth temperature of the second nitride layer is less than a growth temperature of the first nitride layer; a film thickness of the first nitride layer is less than a film thickness of the second nitride layer.

With the aforementioned design, the present invention could effectively reduce the defects, such as cracks, bowing, breakage, etc., of the high electron mobility transistor epitaxial structure by the structure of the first nitride layer and the second nitride layer.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
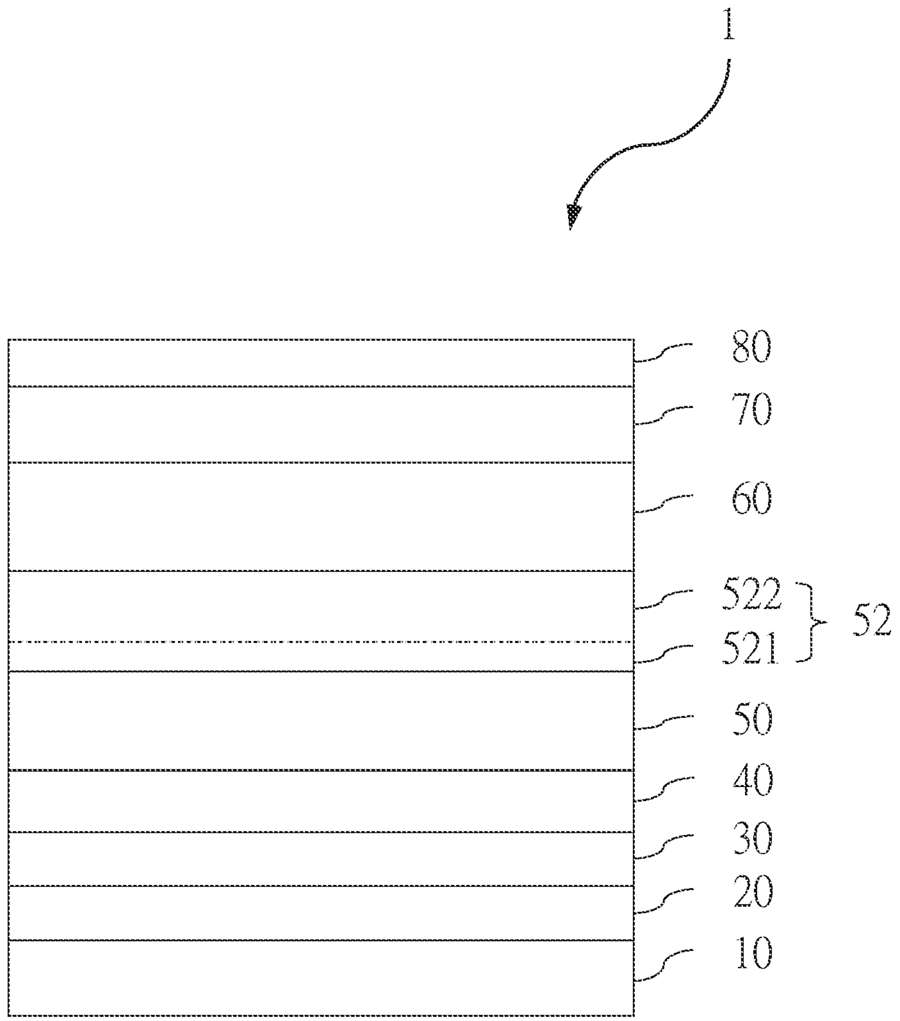
FIG. 1 is a schematic view of the high electron mobility transistor epitaxial structure according to an embodiment of the present invention.

A high electron mobility transistor epitaxial structure 1 according to an embodiment of the present invention is illustrated in FIG. 1 and includes a substrate 10, a nucleation layer 20, a buffer layer 30, a first nitride layer 40, a second nitride layer 50, a channel layer 60, and a barrier layer 70.

The substrate 10 could be, for example, a silicon (Si) substrate, a gallium arsenide (GaAs) substrate, a gallium nitride (GaN) substrate, a silicon carbide (SiC) substrate, or a sapphire ($Al_2O_3$) substrate. The nucleation layer 20 could be, for example, an aluminum nitride (AlN) layer or an aluminum-gallium nitride (AlGaN) layer. In the current embodiment, the buffer layer 30 is made of aluminum-gallium nitride (AlGaN) and has a surface aluminum (Al) concentration of 25%±10%. The first nitride layer 40 and the second nitride layer 50 are respectively a gallium nitride (GaN) layer. The channel layer 60 could be, for example, an aluminum-gallium nitride (AlGaN) channel layer or a gallium nitride (GaN) channel layer. The barrier layer 70 could be, for example, an aluminum-gallium nitride (AlGaN) barrier layer, an aluminum nitride (AlN) barrier layer, an indium aluminum nitride (AlInN) barrier layer, or an indium gallium aluminum nitride (AlInGaN) barrier layer.

In the current embodiment, the high electron mobility transistor epitaxial structure 1 includes a passivation layer 80 and a third nitride layer 52. The passivation layer 80 could be, for example, a silicon nitride (SiN) passivation layer or a gallium nitride (GaN) passivation layer. The third nitride layer 52 is a gallium nitride (GaN) layer. A ratio of a V/III ratio of the second nitride layer 50 to a V/III ratio of the third nitride layer 52 and a V/III ratio of the first nitride layer 40 is 1:4:5. As shown in FIG. 1, the nucleation layer 20 is located above the substrate 10, and the buffer layer 30 is located above the nucleation layer 20. The first nitride layer 40 is located above the buffer layer 30 and is in contact with the buffer layer 30. The second nitride layer 50 is located above the first nitride layer 40 and is in contact with the first nitride layer 40. The channel layer 60 is located above the second nitride layer 50. A two-dimensional electron gas is formed in the channel layer 60 along an interface between the channel layer 60 and the barrier layer 70. The third nitride layer 52 is located above the second nitride layer 50, is in contact with the second nitride layer 50, and is located between the second nitride layer 50 and the channel layer 60. The channel layer 60 is located above the third nitride layer 52. The passivation layer 80 is located above the barrier layer 70. In other embodiments, the high electron mobility transistor epitaxial structure 1 could be provided without the third nitride layer 52.

In the current embodiment, a film thickness of the first nitride layer 40 is less than a film thickness of the second nitride layer 50, wherein a ratio of the film thickness of the second nitride layer 50 to the film thickness of the first nitride layer 40 satisfies a range being greater than or equal to 1 and being less than or equal to 6. Preferably, the ratio of the film thickness of the second nitride layer 50 to the film thickness of the first nitride layer 40 is 3. A sum of the film thickness of the second nitride layer 50 and the film thickness of the first nitride layer 40 is less than or equal to 1 um. Preferably, the sum of the film thickness of the second nitride layer 50 and the film thickness of the first nitride layer 40 is greater than or equal to 0.5 um and is less than or equal to 1 um.

In the current embodiment, the second nitride layer 50 is carbon doped, wherein a carbon concentration of the first nitride layer 40 is smaller than a carbon concentration of the second nitride layer 50. A ratio of the carbon concentration of the second nitride layer 50 to the carbon concentration of the first nitride layer 40 is greater than or equal to 10.

In the current embodiment, a film thickness of the third nitride layer 52 ranges between 2.5 um and 3.5 um. The third nitride layer 52 includes a plurality of third nitride films and is a superlattice layer formed by stacking the third nitride films, wherein a ratio of a carbon concentration of one of two adjacent third nitride films with the larger carbon concentration to a carbon concentration of the other third nitride film with the smaller carbon concentration satisfies a range greater than or equal to 10. In the current embodiment, the third nitride layer 52 includes a lightly doped nitride layer 521 and a highly doped nitride layer 522 as an example. In other embodiments, the third nitride layer 52 could include a plurality of lightly doped nitride layers 521 and a plurality of highly doped nitride layers 522, wherein the lightly doped nitride layers 521 and the highly doped nitride layers 522 are alternately stacked.

In the current embodiment, an absolute value of a BOW of the high electron mobility transistor epitaxial structure 1 is less than 30 um, wherein the high electron mobility transistor epitaxial structure 1 is a 8-inch wafer. The value of the BOW is a bowing degree of the wafer and a bowing direction of the wafer, wherein a positive BOW value is a degree of the wafer bowing upward, and a negative BOW value is a degree of the wafer bowing downward. A number of defects with a diameter greater than 0.5 um per square centimeter of a surface of the passivation layer 80 is less than 10. The defects could be, for example, hexagonal defects, stacking faults, pit defects, or other common defects occurred in the epitaxial process, but the defects do not include defects formed by an external force, such as particles or scratches. A length of a longest crack extending inward from an outer peripheral edge of the passivation layer 80 of the high electron mobility transistor epitaxial structure 1 is less than or equal to 3 mm, wherein the crack could be, for example, a crack extending inward from an outer peripheral edge of the wafer. A breakdown voltage of the high electron mobility transistor epitaxial structure 1 is greater than or equal to 0.09 V/nm. Through X-ray diffraction analysis, a full width at half maximum (FWHM) of a (102) face of the high electron mobility transistor epitaxial structure 1 is less than 700 arcsec, and a full width at half maximum (FWHM) of a (002) face of the high electron mobility transistor epitaxial structure 1 is less than 600 arcsec.

Figure 3:
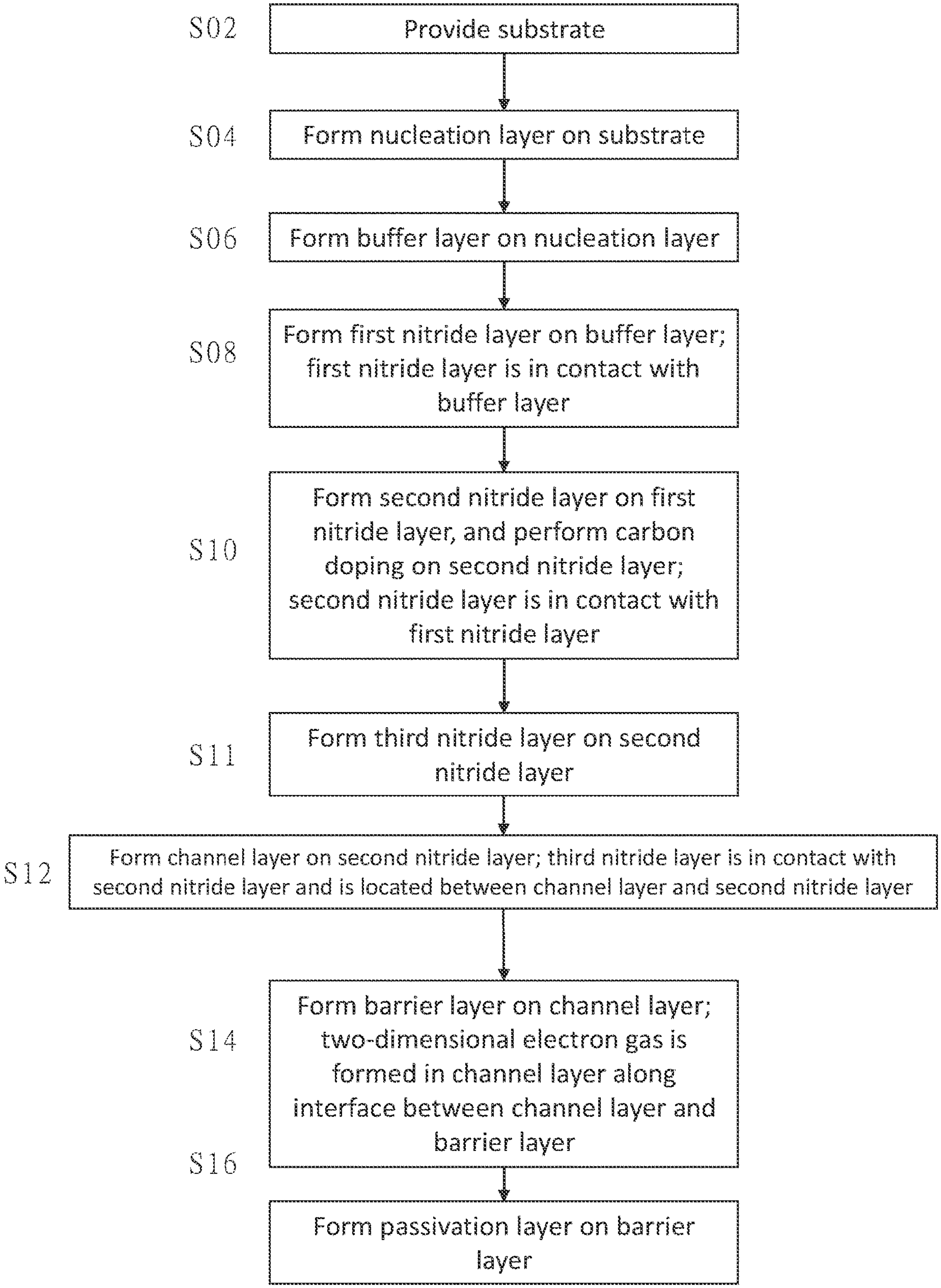
FIG. 3 is a flowchart of the method for epitaxy of the high electron mobility transistor according to an embodiment of the present invention.

A method for epitaxy of a high electron mobility transistor according to an embodiment is illustrated in FIG. 3 and is adapted to form the high electron mobility transistor epitaxial structure 1. The method for epitaxy of the high electron mobility transistor includes following steps:

step S02: provide a substrate 10, wherein the substrate 10 could be a silicon (Si) substrate, a gallium arsenide (GaAs) substrate, a gallium nitride (GaN) substrate, a silicon carbide (SiC) substrate, or a sapphire ($Al_2O_3$) substrate;

step S04: form a nucleation layer 20 on the substrate 10, wherein the nucleation layer 20 could be formed on the substrate 10 by metal organic chemical vapor deposition (MOCVD); the nucleation layer 20 could be, for example, an aluminum nitride (AlN) layer or an aluminum-gallium nitride (AlGaN) layer;

step S06: form a buffer layer 30 on the nucleation layer 20, wherein the buffer layer 30 could be formed on the nucleation layer 20 by metal organic chemical vapor deposition (MOCVD); the buffer layer 30 is made of aluminum-gallium nitride (AlGaN) and has a surface aluminum (Al) concentration is 25%±10%;

step S08: form a first nitride layer 40 on the buffer layer 30, wherein the first nitride layer 40 is in contact with the buffer layer 30; the first nitride layer 40 could be formed on the buffer layer 30 by metal organic chemical vapor deposition (MOCVD); the first nitride layer 40 is a gallium nitride (GaN) layer;

step S10: form a second nitride layer 50 on the first nitride layer 40 and perform carbon doping on the second nitride layer 50, wherein the second nitride layer 50 is in contact with the first nitride layer 40; the second nitride layer 50 could be formed on the first nitride layer 40 by metal organic chemical vapor deposition (MOCVD); the second nitride layer 50 is a gallium nitride (GaN) layer;

a growth temperature of the second nitride layer 50 is less than a growth temperature of the first nitride layer 40; in the current embodiment, a difference between the growth temperature of the first nitride layer 40 and the growth temperature of the second nitride layer 50 is greater than or equal to 100° C., and a V/III ratio of the second nitride layer 50 is less than a V/III ratio of the first nitride layer 40; a ratio of a carbon concentration of the second nitride layer 50 to a carbon concentration of the first nitride layer 40 is greater than or equal to 10; a film thickness of the first nitride layer 40 is less than a film thickness of the second nitride layer 50; a ratio of the film thickness of the second nitride layer 50 to the film thickness of the first nitride layer 40 satisfies a range being greater than or equal to 1 and being less than or equal to 6; preferably, the ratio of the film thickness of the second nitride layer 50 to the film thickness of the first nitride layer 40 is 3; a sum of the film thickness of the second nitride layer 50 and the film thickness of the first nitride layer 40 is less than or equal to 1 um; preferably, the sum of the film thickness of the second nitride layer 50 and the film thickness of the first nitride layer 40 is greater than or equal to 0.5 um and is less than or equal to 1 um; in other words, the first nitride layer 40 and the second nitride layer 50 are respectively formed under different growth conditions, including temperature, V/III gas flow rate, thickness, carbon doping concentration, etc.;

step S12: form a channel layer 60 on the second nitride layer 50; the channel layer 60 could be formed on the second nitride layer 50 by metal organic chemical vapor deposition (MOCVD); the channel layer 60 could be, for example, an aluminum-gallium nitride (AlGaN) channel layer or a gallium nitride (GaN) channel layer; in the current embodiment, a thickness of the channel layer 60 ranges between 100 nm and 500 nm; and step S14: form a barrier layer 70 on the channel layer 60, wherein a two-dimensional electron gas is formed in the channel layer 60 along an interface between the channel layer 60 and the barrier layer 70; the barrier layer 70 could be formed on the channel layer 60 by metal organic chemical vapor deposition (MOCVD); the barrier layer 70 could be, for example, an aluminum-gallium nitride (AlGaN) barrier layer, an aluminum nitride (AlN) barrier layer, an indium aluminum nitride (AlInN) barrier layer, or an indium gallium aluminum nitride (AlInGaN) barrier layer.

Figure 2:
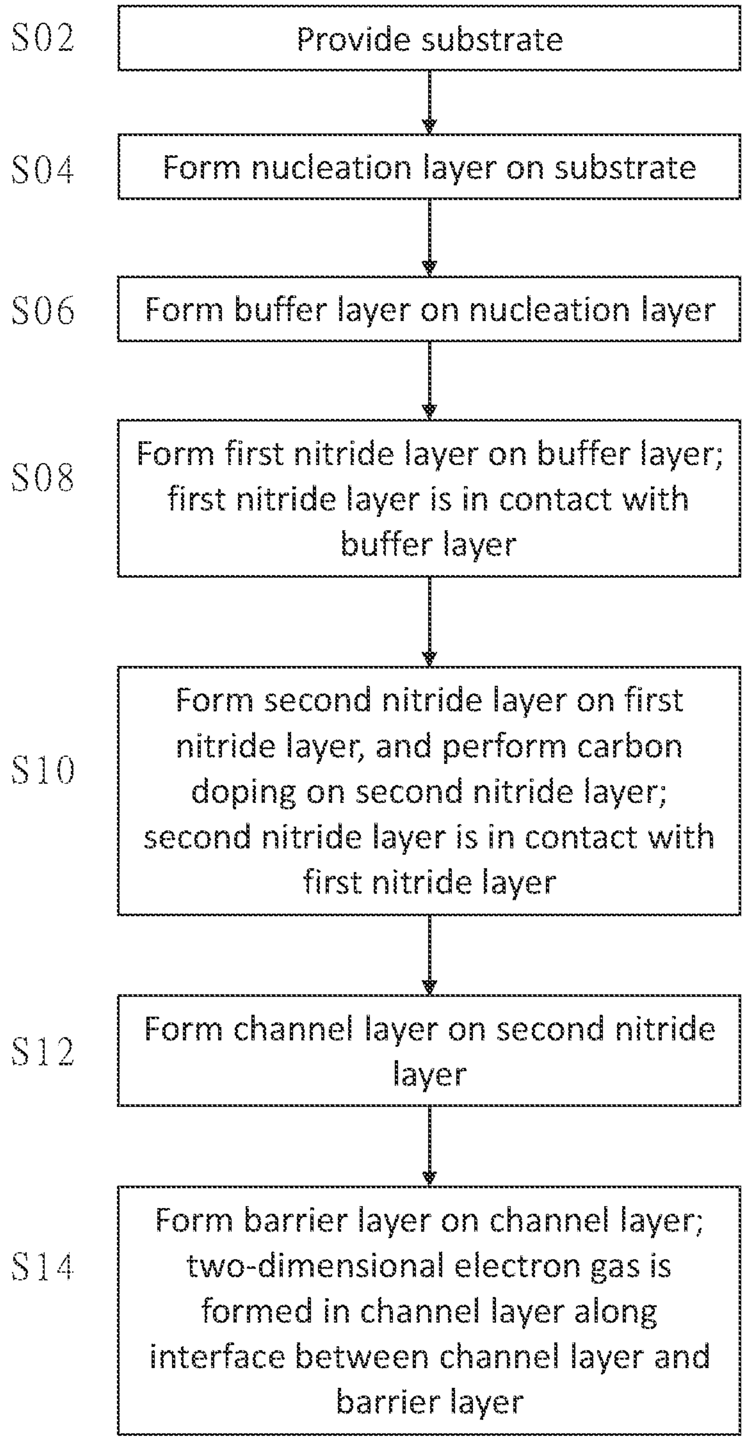
FIG. 2 is a flowchart of the method for epitaxy of the high electron mobility transistor according to another embodiment of the present invention.

In the current embodiment, the method for epitaxy of the high electron mobility transistor further includes step S11 to form a third nitride layer 52 on the second nitride layer 50 between step S10 and step S12. The third nitride layer 52 could be formed on the second nitride layer 50 by metal organic chemical vapor deposition (MOCVD). The third nitride layer 52 is in contact with the second nitride layer 50 and is located between the channel layer 60 and the second nitride layer 50. The third nitride layer 52 is a gallium nitride (GaN) layer. In other embodiments, step S11 could be omitted as shown in FIG. 2.

In the current embodiment, the growth temperature of the second nitride layer 50 is less than a growth temperature of the third nitride layer 52. Preferably, the growth temperature of the second nitride layer 50 is less than the growth temperature of the first nitride layer 40 and is less than the growth temperature of the third nitride layer 52, and a difference between the growth temperature of the second nitride layer 50 and the growth temperature of the first nitride layer 40 is greater than 100° C. and a difference between the growth temperature of the second nitride layer 50 and the growth temperature of the third nitride layer 52 is greater than 100° C. A ratio of a V/III ratio of the second nitride layer 50 to a V/III ratio of the third nitride layer 52 and a V/III ratio of the first nitride layer 40 is 1:4:5. A film thickness of the third nitride layer 52 ranges between 2.5 um and 3.5 um. The third nitride layer 52 includes a plurality of third nitride films and is a superlattice layer formed by stacking the third nitride films, wherein a ratio of a carbon concentration of one of two adjacent third nitride films with the larger carbon concentration to a carbon concentration of the other third nitride film with the smaller carbon concentration satisfies a range greater than or equal to 10.

In the current embodiment, the method for epitaxy of the high electron mobility transistor further includes step S16 to form a passivation layer 80 on the barrier layer 70 after step S14. The passivation layer 80 could be formed on the barrier layer 70 by metal organic chemical vapor deposition (MOCVD). The passivation layer 80 could be, for example, an aluminum-gallium nitride (AlGaN) passivation layer, an aluminum nitride (AlN) passivation layer, an indium aluminum nitride (AlInN) passivation layer, or an indium gallium aluminum nitride (AlInGaN) passivation layer.

In the current embodiment, the method for epitaxy of the high electron mobility transistor includes analysing the high electron mobility transistor epitaxial structure 1 formed by the method for epitaxy of the high electron mobility transistor, wherein an absolute value of a BOW of the high electron mobility transistor epitaxial structure 1 is less than 30 um. The high electron mobility transistor epitaxial structure 1 subject to analysis is a 8-inch wafer. The value of the BOW is a bowing degree of the wafer and a bowing direction of the wafer, wherein a positive BOW value is a degree of the wafer bowing upward, and a negative BOW value is a degree of the wafer bowing downward. A number of defects with a diameter greater than 0.5 um per square centimeter of a surface of the passivation layer 80 is less than 10. The defects could be, for example, hexagonal defects, stacking faults, pit defects, or other common defects occurred in the epitaxial process, but the defects do not include defects formed by an external force, such as particles or scratches. A length of a longest crack extending inward from an outer peripheral edge of the passivation layer 80 of the high electron mobility transistor epitaxial structure 1 is less than or equal to 3 mm, wherein for example, the crack could be, for example, a crack extending inward from an outer peripheral edge of the wafer. A breakdown voltage of the high electron mobility transistor epitaxial structure 1 is greater than or equal to 0.09 V/nm. Through X-ray diffraction analysis, a full width at half maximum (FWHM) of a (102) face of the high electron mobility transistor epitaxial structure 1 is less than 700 arcsec, and a full width at half maximum (FWHM) of a (002) face of the high electron mobility transistor epitaxial structure 1 is less than 600 arcsec.

A comparative example 1 and an embodiment 1 of the present invention are illustrated in the below description.

The Comparative Example 1

Figure 4:
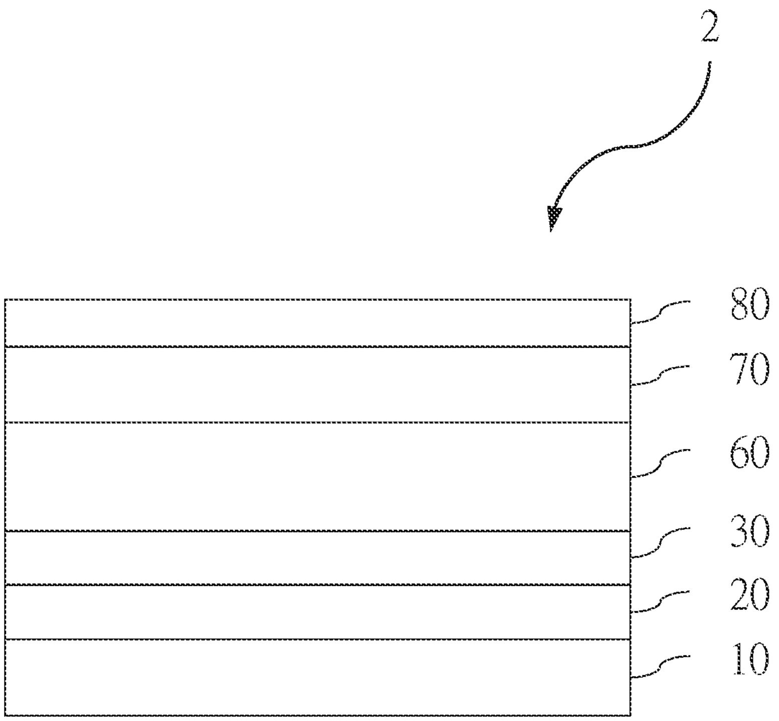
FIG. 4 is a schematic view of the high electron mobility transistor epitaxial structure according to a comparative example 1 of the present invention.

A high electron mobility transistor epitaxial structure 2 according to the comparative example 1 is illustrated in FIG. 4, which has almost the same structure as the high electron mobility transistor epitaxial structure 1 of the embodiment and includes the substrate 10, the nucleation layer 20, the buffer layer 30, the channel layer 60, the barrier layer 70, and the passivation layer 80, except that the high electron mobility transistor epitaxial structure 2 of the comparative example 1 does not have the first nitride layer 40, the second nitride layer 50, and the third nitride layer 52.

The Embodiment 1

The high electron mobility transistor epitaxial structure 1 formed by the method for epitaxy of the high electron mobility transistor is illustrated in FIG. 1.

Growth conditions of the first nitride layer 40 are illustrated in the following description.

A growth temperature of the first nitride layer 40 is 1050° C., and a gas flow ratio of nitrogen (N)/hydrogen (H) is 1:1. An epitaxial thickness of the first nitride layer 40 is 250 nm. The first nitride layer 40 is provided without carbon doping, wherein a background carbon concentration of the first nitride layer 40 is less than 5E17 $cm^{-3}$.

Growth conditions of the second nitride layer 50 are illustrated in the following description.

A growth temperature of the second nitride layer 50 is 940° C., and a gas flow ratio of nitrogen (N)/hydrogen (H) is 6:4. An epitaxial thickness of the second nitride layer 50 is 750 nm. The second nitride layer 50 is carbon doped, wherein a carbon concentration of the second nitride layer 50 ranges between 5E18 $cm^{-3}$ and 5E19 $cm^{-3}$.

Growth conditions of the third nitride layer 52 are illustrated in the following description.

A growth temperature of the third nitride layer 52 is 1055° C., and a gas flow ratio of nitrogen (N)/hydrogen (H) is 1:2. A film thickness of the third nitride layer 52 ranges between 2.5 um and 3.5 um. The third nitride layer 52 includes a lightly doped nitride layer 521 and a highly doped nitride layer 522 and is a superlattice layer formed by stacking the lightly doped nitride layer 521 and the highly doped nitride layer 522. The lightly doped nitride layer 521 has an epitaxial thickness ranging between 10 nm and 100 nm and is provided without carbon doping, wherein a carbon concentration of the lightly doped nitride layer 521 is less than 1E18 $cm^{-3}$. The highly doped nitride layer 522 has an epitaxial thickness ranging between 100 nm and 500 nm and is carbon doped, wherein a carbon concentration of the highly doped nitride layer 522 ranges between 5E18 $cm^{-3}$ and 5E19 $cm^{-3}$.

A ratio of a V/III ratio of the second nitride layer 50 to a V/III ratio of the third nitride layer 52 and a V/III ratio of the first nitride layer 40 is 1:4:5.

Analysis results of the high electron mobility transistor epitaxial structure 2 of the comparative example 1 and the high electron mobility transistor epitaxial structure of the embodiment 1 are illustrated in Table 1, wherein the high electron mobility transistor epitaxial structure of the comparative example 1, which does not have the first nitride layer 40 and the second nitride layer 50, has a poorer performance of a length of a longest crack, a BOW, a full width at half maximum (FWHM) of a (102) face, and a defect density than the high electron mobility transistor epitaxial structure 1 of the embodiment 1. In other words, the embodiment 1 could effectively reduce cracks, bowing, and defects of the high electron mobility transistor epitaxial structure 1 by the first nitride layer 40 and the second nitride layer 50, thereby increasing the epitaxial quality of the high electron mobility transistor structure.

Additionally, referring to Table 1, as the high electron mobility transistor epitaxial structure 2 of the comparative example 1 does not have the first nitride layer 40, the second nitride layer 50, and the third nitride layer 52, the high electron mobility transistor epitaxial structure 2 of the comparative example 1 has a poorer performance of a breakdown voltage than the high electron mobility transistor epitaxial structure 1 of the embodiment 1. In other words, and the third nitride layer 52, the embodiment 1 could effectively increase the performance of the breakdown voltage of the high electron mobility transistor epitaxial structure 1 by the first nitride layer 40, the second nitride layer 50.

TABLE 1

| Analysis results | The comparative example 1 | The embodiment 1 |
|---|---|---|
| Length of longest crack (mm) | >5 | <3 |
| BOW (um) | <−40 | ≤30 and ≥−30 |
| FWHM of (002) face (arcsec) | <600 | <600 |
| FWHM of (102) face (arcsec) | <900 | <700 |
| Defect density (ea/$cm^2$) | >50 | <10 |
| Breakdown voltage (V/nm) | <0.05 | ≥0.09 |

Comparative examples 2 to 5 are illustrated in the following description.

In the embodiment 1, a thickness of the channel layer 60 ranges between 100 nm and 500 nm, and a film thickness of the third nitride layer 52 ranges between 2.5 um and 3.5 um. A film thickness of the first nitride layer 40 accounts for 25% of a sum of the film thickness of the first nitride layer 40 and a film thickness of the second nitride layer 50, and the film thickness of the second nitride layer 50 accounts for 75% of the sum of the film thickness of the first nitride layer 40 and the film thickness of the second nitride layer 50. In other words, a ratio of the film thickness of the second nitride layer 50 to the film thickness of the first nitride layer 40 is 3.

The Comparative Examples 2 to 5

Each of the comparative examples 2 to 5 has almost the same structure as the high electron mobility transistor epitaxial structure 1 of the embodiment 1, wherein the thickness of the channel layer 60 of each of the comparative examples 2 to 5 ranges between 100 nm and 500 nm, and the film thickness of the third nitride layer 52 ranges between 2.5 um and 3.5 um. The difference between the comparative examples 2 to 5 and the embodiment 1 is that the film thickness of the first nitride layer 40 of the comparative example 2 accounts for 0% of the sum of the film thickness of the first nitride layer 40 and the film thickness of the second nitride layer 50, and the film thickness of the second nitride layer 50 of the comparative example 2 accounts for 100% of the sum of the film thickness of the first nitride layer 40 and the film thickness of the second nitride layer 50; the film thickness of the first nitride layer 40 of the comparative example 3 accounts for 50% of the sum of the film thickness of the first nitride layer 40 and the film thickness of the second nitride layer 50, and the film thickness of the second nitride layer 50 of the comparative example 3 accounts for 50% of the sum of the film thickness of the first nitride layer 40 and the film thickness of the second nitride layer 50; the film thickness of the first nitride layer 40 of the comparative example 4 accounts for 75% of the sum of the film thickness of the first nitride layer 40 and the film thickness of the second nitride layer 50, and the film thickness of the second nitride layer 50 of the comparative example 4 accounts for 25% of the sum of the film thickness of the first nitride layer 40 and the film thickness of the second nitride layer 50; the film thickness of the first nitride layer 40 of the comparative example 5 accounts for 100% of the sum of the film thickness of the first nitride layer 40 and the film thickness of the second nitride layer 50, and the film thickness of the second nitride layer 50 of the comparative example 5 accounts for 0% of the sum of the film thickness of the first nitride layer 40 and the film thickness of the second nitride layer 50.

Analysis results of the high electron mobility transistor epitaxial structure of each of the comparative examples 2 to 5 and the high electron mobility transistor epitaxial structure 1 of the embodiment 1 are illustrated in Table 2. The high electron mobility transistor epitaxial structure 1 of the embodiment 1 has a better performance of a breakdown voltage and a lower defect density than the high electron mobility transistor epitaxial structure of each of the comparative examples 2 to 5. Thus, when the ratio of the film thickness of the second nitride layer 50 to the film thickness of the first nitride layer 40 is 3, the high electron mobility transistor epitaxial structure 1 has the better performance of the breakdown voltage and the lower defect density.

TABLE 2

| Analysis results | The embodiment 1 | The comparative example 2 | The comparative example 3 | The comparative example 4 | The comparative example 5 |
|---|---|---|---|---|---|
| Length of longest crack (mm) | <3 | >3 | <3 | <3 | <3 |
| BOW (um) | ≤30 and ≥−30 | <−30 | ≤30 and ≥−30 | ≤30 and ≥−30 | ≤30 and ≥−30 |
| FWHM of (002) face (arcsec) | <600 | <600 | <600 | <600 | <600 |
| FWHM of (102) face (arcsec) | <700 | <1000 | <700 | <700 | <700 |
| Defect density (ea/$cm^2$) | <10 | >60 | 10~25 | 26~40 | 40~60 |
| Breakdown voltage (V/nm) | ≥0.09 | 0.05~0.07 | 0.05~0.08 | 0.05~0.08 | <0.05 |

With the aforementioned design, the present invention could effectively reduce the defects, such as cracks, bowing, breakages, etc., of the high electron mobility transistor epitaxial structure 1 by the structure of the first nitride layer 40 and the second nitride layer 50. Additionally, the performance of the breakdown voltage of the high electron mobility transistor epitaxial structure 1 could be improved by the first nitride layer 40, the second nitride layer 50, and the third nitride layer 52.

It must be pointed out that the embodiments described above are only some preferred embodiments of the present invention. All equivalent structures and methods which employ the concepts disclosed in this specification and the appended claims should fall within the scope of the present invention.

What is claimed is:

1. A method for epitaxy of a high electron mobility transistor epitaxial structure, comprising:
- providing a substrate;
- forming a nucleation layer on the substrate;
- forming a buffer layer on the nucleation layer;
- forming a first nitride layer on the buffer layer, wherein the first nitride layer is in contact with the buffer layer;
- forming a second nitride layer on the first nitride layer, and performing carbon doping on the second nitride layer, wherein the second nitride layer is in contact with the first nitride layer;
- forming a channel layer on the second nitride layer; and
- forming a barrier layer on the channel layer, wherein a two-dimensional electron gas is formed in the channel layer along an interface between the channel layer and the barrier layer;
- forming a third nitride layer on the second nitride layer, wherein the third nitride layer is in contact with the second nitride layer and is located between the channel layer and the second nitride layer; the growth temperature of the second nitride layer is less than a growth temperature of the third nitride layer,
- wherein a growth temperature of the second nitride layer is less than a growth temperature of the first nitride layer; a film thickness of the first nitride layer is less than a film thickness of the second nitride layer.

2. The method for epitaxy of the high electron mobility transistor epitaxial structure as claimed in claim 1, wherein a difference between the growth temperature of the first nitride layer and the growth temperature of the second nitride layer is greater than or equal to 100° C.

3. The method for epitaxy of the high electron mobility transistor epitaxial structure as claimed in claim 1, wherein a V/III ratio of the second nitride layer is less than a V/III ratio of the first nitride layer.

4. The method for epitaxy of the high electron mobility transistor epitaxial structure as claimed in claim 1, wherein a ratio of a carbon concentration of the second nitride layer to a carbon concentration of the first nitride layer is greater than or equal to 10.

5. The method for epitaxy of the high electron mobility transistor epitaxial structure as claimed in claim 1, wherein a ratio of the film thickness of the second nitride layer to the film thickness of the first nitride layer satisfies a range being greater than or equal to 1 and being less than or equal to 6.

6. The method for epitaxy of the high electron mobility transistor epitaxial structure as claimed in claim 1, wherein a sum of the film thickness of the second nitride layer and the film thickness of the first nitride layer is less than or equal to 1 um.

7. The method for epitaxy of the high electron mobility transistor epitaxial structure as claimed in claim 5, wherein a sum of the film thickness of the second nitride layer and the film thickness of the first nitride layer is less than or equal to 1 um.

8. The method for epitaxy of the high electron mobility transistor epitaxial structure as claimed in claim 1, wherein a ratio of a V/III gas flow ratio of the second nitride layer to a V/III gas flow ratio of the third nitride layer and a V/III gas flow ratio of the first nitride layer is 1:4:5.

9. The method for epitaxy of high electron mobility transistor epitaxial structure as claimed in claim 1, wherein the first nitride layer, the second nitride layer, and the third nitride layer respectively comprise gallium nitride.

10. The method for epitaxy of the high electron mobility transistor epitaxial structure as claimed in claim 1, wherein a film thickness of the third nitride layer ranges 2.5 um and 3.5 um.

11. The method for epitaxy of the high electron mobility transistor epitaxial structure as claimed in claim 10, wherein the third nitride layer comprises a plurality of third nitride films; the plurality of third nitride films are stacked, wherein a ratio of a carbon concentration of one of two adjacent third nitride films with the larger carbon concentration to a carbon concentration of the other third nitride film with the smaller carbon concentration satisfies a range greater than or equal to 10.

12. The method for epitaxy of the high electron mobility transistor epitaxial structure as claimed in claim 1, further comprising forming a passivation layer on the barrier layer.

13. The method for epitaxy of the high electron mobility transistor epitaxial structure as claimed in claim 12, wherein an absolute value of a BOW of the high electron mobility transistor epitaxial structure is less than 30 um.

14. The method for epitaxy of the high electron mobility transistor epitaxial structure as claimed in claim 12, wherein a full width at half maximum (FWHM) of a (1012) face of the high electron mobility transistor epitaxial structure 1 is less than 700 arcsec.

15. The method for epitaxy of the high electron mobility transistor epitaxial structure as claimed in claim 12, wherein a full width at half maximum (FWHM) of a (0002) face of the high electron mobility transistor epitaxial structure 1 is less than 600 arcsec.

16. The method for epitaxy of the high electron mobility transistor epitaxial structure as claimed in claim 12, wherein a number of defects with a diameter greater than 0.5 um per square centimeter of a surface of the passivation layer is less than 10; wherein the defects are pit defects.

17. The method for epitaxy of the high electron mobility transistor epitaxial structure as claimed in claim 1, wherein the buffer layer is made of aluminum-gallium nitride (AlGaN) and has a surface aluminum (Al) concentration of 25%±10%.

* * * * *